US012668879B2

(12) United States Patent (10) Patent No.: US 12,668,879 B2
Mizutani et al. (45) Date of Patent: Jun. 30, 2026

(54) ATOMIC LAYER DEPOSITION METHOD FOR METAL THIN FILMS

(71) Applicant: KOJUNDO CHEMICAL LABORATORY CO., LTD., Sakado (JP)

(72) Inventors: Fumikazu Mizutani, Sakado (JP);
Shintaro Higashi, Sakado (JP);
Naoyuki Takezawa, Sakado (JP)

(73) Assignee: KOJUNDO CHEMICAL LABORATORY CO., LTD., Sakado (JP)

( * ) Notice: Subject to any disclaimer, the term of this patent is extended or adjusted under 35 U.S.C. 154(b) by 0 days.

(21) Appl. No.: 18/482,342

(22) Filed: Oct. 6, 2023

(65) Prior Publication Data

US 2024/0060180 A1 Feb. 22, 2024

Related U.S. Application Data

(62) Division of application No. 16/617,451, filed as application No. PCT/JP2018/026464 on Jul. 13, 2018, now Pat. No. 11,807,939.

(30) Foreign Application Priority Data

Jul. 18, 2017 (JP) ................................. 2017-139151
Jul. 18, 2017 (JP) ................................. 2017-139152

(51) Int. Cl.
*C23C 16/455* (2006.01)
*C23C 16/18* (2006.01)
*H10P 14/40* (2026.01)

(52) U.S. Cl.
CPC ........ *C23C 16/45553* (2013.01); *C23C 16/18* (2013.01); *H10P 14/40* (2026.01)

(58) Field of Classification Search
None
See application file for complete search history.

(56) References Cited

U.S. PATENT DOCUMENTS

| | | | | |
|---|---|---|---|---|
| 8,795,771 B2 * | 8/2014 | Barry | .................. | C23C 16/34 |
| | | | | 427/248.1 |
| 2004/0105934 A1 * | 6/2004 | Chang | ............... | H01L 21/76874 |
| | | | | 257/E21.171 |
| 2006/0211228 A1 * | 9/2006 | Matsuda | .................. | C23C 16/18 |
| | | | | 438/575 |
| 2008/0026578 A1 | 1/2008 | Shenai-Khatkhate et al. | | |
| 2008/0311746 A1 * | 12/2008 | Dussarrat | ................. | C23C 16/18 |
| | | | | 556/11 |
| 2009/0203928 A1 | 8/2009 | Thompson et al. | | |
| 2010/0022790 A1 * | 1/2010 | Dussarrat | .......... | C23C 16/45553 |
| | | | | 556/35 |
| 2012/0264310 A1 * | 10/2012 | Uehigashi | ......... | H01L 21/28562 |
| | | | | 438/758 |

| | | | |
|---|---|---|---|
| 2014/0234550 A1 | 8/2014 | Winter et al. | |
| 2014/0248427 A1 | 9/2014 | Machida et al. | |
| 2018/0258526 A1 | 9/2018 | Harada et al. | |
| 2020/0087787 A1 | 3/2020 | Mizutani et al. | |

FOREIGN PATENT DOCUMENTS

| | | |
|---|---|---|
| CN | 101508706 A | 8/2009 |
| JP | 2008-538126 A | 10/2008 |
| JP | 2012-229488 A | 11/2012 |
| JP | 2013-545755 A | 12/2013 |
| JP | 5916744 B2 | 5/2016 |
| JP | 6041464 B2 | 12/2016 |
| JP | 6043851 B1 | 12/2016 |
| JP | 2017-085131 A | 5/2017 |
| KR | 10-1069299 B1 | 10/2011 |
| KR | 10-1363222 B1 | 2/2014 |
| TW | 556314 B | 10/2003 |
| TW | 201708596 A | 3/2017 |

OTHER PUBLICATIONS

Kawano et al. "Low-Temperature Preparation of Metallic Ruthenium Films by MOCVD Using Bis(2,4-dimethylpentadienyl)ruthenium" Electrochemical and Solid-State Letters, 2007. 10 _6_ D60-D62 (Year: 2007).*

Swart. "Metal-ligand bonding in metallocenes: Differentiation between spin state, electrostatic and covalent bonding". Inorganica Chimica Acta. vol. 360 (2007). pp. 179-189 (hereafter "Swart") (Year: 2007).*

The First Office Action issued on Jun. 30, 2021, by the State Intellectual Property Office of People's Republic of China corresponding Chinese Patent Application No. 201880047781.6, 16 pages including 8 pages of English Translation.

Gold, trimethyl(trimethylphosphine), NIH Library of Medicine, Retrieved from: trimethyl(trimethylphosphine)https://chenn.nlnn.nih.gov/chennidplus/rn/33012-33-8, 2021, 2 pages.

Griffiths, et al., "Atomic Layer Deposition of Gold Metal", Chemistry of Materials, vol. 28, No. 1, 2016 , pp. 44-46.

Jeon, et al., "Fabrication of Robust Triple-Ti1-xAlxN Metal Gate by Atomic Layer Deposition", Journal of the Electrochemical Society, vol. 157, No. 12, 2010, pp. H1101-H1105.

Notice of Reasons for Refusal issued on Sep. 6, 2022, by the Japanese Patent Office in corresponding Japanese Patent Application No. 2019-531006, 4 pages including 2 pages of English Translation.

(Continued)

*Primary Examiner* — Jose I Hernandez-Kenney

(74) *Attorney, Agent, or Firm* — BUCHANAN INGERSOLL & ROONEY PC

(57) ABSTRACT

Provided is a method for depositing a metal thin film by atomic layer deposition (ALD) using an organometallic complex as a source material and without using radical species such as plasma and ozone, which have a possibility of deactivation. The method is an atomic layer deposition (ALD) method for metal thin films which includes: a process of supplying an organometallic complex having an aromatic anionic ligand and/or an alkyl ligand into a reaction chamber in which a substrate is installed; and a process of supplying a mixture gas containing a nucleophilic gas and an electrophilic gas into the reaction chamber, the ALD method substantially not using either one of a gas in a plasma or radical state and a gas containing oxygen atoms.

3 Claims, No Drawings

(56)                 References Cited

OTHER PUBLICATIONS

Kawano, et al., "Low-Temperature Preparation of Metallic Ruthenium Films by MOCVD Using Bis(2,4-dimethylpentadienyl)ruthenium", Electrochemical and Solid-State Letters, vol. 10, No. 6, 2007, pp. D60-D62.

Park, et al., "Thermal and Plasma Enhanced Atomic Layer Deposition Ruthenium and Electrical Characterization as a Metal Electrode", Microelectronic Engineering, vol. 85, Issue 1, Jan. 2008, pp. 39-44.

International Search Report (with English Translation) and Written Opinion dated Oct. 2, 2018, issued in the corresponding International Patent Application No. PCT/JP2018/026464, 8 pages.

Office Action dated Feb. 19, 2019, issued in the corresponding Taiwanese Patent Application No. 107124776, 5 pages.

* cited by examiner

ATOMIC LAYER DEPOSITION METHOD FOR METAL THIN FILMS

CROSS-REFERENCES TO RELATED APPLICATIONS

This application is a divisional of application Ser. No. 16/617,451 filed Nov. 26, 2019, which is a 371 application of International Application PCT/JP2018/026464 filed on Jul. 13, 2018, which claims priority to Japanese Application No. 2017-139151 filed on Jul. 18, 2017 and Japanese Application No. 2017-139512 filed on Jul. 18, 2017, the entire content of which is incorporated by reference.

TECHNICAL FIELD

The present invention relates to a method for forming a metal thin film by atomic layer deposition (ALD).

BACKGROUND ART

An atomic layer deposition (ALD) method is known as a technology which is superior, in step coverage and film thickness controllability, to a general chemical vapor deposition (CVD) method. The ALD method is a technology of forming a thin film on a layer by layer basis at the atomic level, where the thin film formation is generally performed by repeating two processes of, respectively, (1) causing only a single layer of a source material to react with or be adsorbed onto a substrate surface, and purging excess source material, and (2) supplying a reactive gas, such as an oxidant and a reductant, and causing the source material on the substrate to react with the reactive gas and thereby be transformed into an intended deposit. As described above, the ALD method is performed by depositing the source material layer by layer, instead of depositing it continuously, and accordingly the ALD method has a feature of giving excellent step coverage and film thickness controllability. Further, an insulating film can be formed at a relatively low temperature by the ALD method because the method does not use thermal decomposition of the source material, and it accordingly is expected that the ALD method is applied to, for example, fabrication of a capacitor in a memory device and of a gate insulator of a thin film transistor in a display device employing a glass substrate, such as a liquid crystal display, and the like.

Specifically, in the ALD method, an intended material is deposited by using a vaporized source material as a precursor and causing it to be adsorbed to saturation onto a substrate at a temperature at which the precursor does not thermally decompose, and by causing, in the next process, the adsorbed precursor to chemically react with a reactive gas on the substrate surface.

For example, Patent Literature (PTL) 1 discloses a metal thin film formation method including: a source material transport process for transporting an organometallic compound source material having a cyclopentadienyl-based ligand onto a target object for the thin film formation, which is installed in a vacuum chamber; and a reactive gas transport process for causing a reactive gas, such as ammonia, to be in contact with a heated metal catalyst and subsequently transporting the reactive gas onto the target object for the thin film deposition installed in the vacuum chamber.

PTL 2 discloses a method for depositing a material onto a substrate surface which includes: a step of forming a barrier layer on a substrate; a step of exposing the barrier layer to plasma; a step of exposing the substrate to dicobalt hexacarbonyl butylacetylene and hydrogen, thereby forming a cobalt layer on the barrier layer, during a vapor deposition process; a step of exposing the cobalt layer to hydrogen plasma; and a step of depositing a conductive material in a form of covering the cobalt layer, where plasma and an ammonia/hydrogen mixture are used in the cobalt layer deposition.

Non-Patent Literature (NPL) 1 discloses that, when bis(cyclopentadienyl)ruthenium or bis(ethylcyclopentadienyl)ruthenium is used as a precursor, there occurs a problem in nucleation when a thermal ALD is performed at 300° C. using oxygen, but a ruthenium thin film can be formed by an ALD method using ammonia plasma. In NPL 1, it is described that, in the case of the thermal ALD, there occurs the problem in nucleation, that is, a problem in that thin film deposition is unlikely to proceed before a ruthenium thin layer to be a nucleus is formed because oxidative decomposition of a ligand on ruthenium caused by oxygen is likely to occur only on a surface of a ruthenium thin layer, but in the case of the ALD using ammonia plasma, a ruthenium thin layer to be a nucleus is not required, and accordingly a low-resistivity and high-purity ruthenium thin film is obtained.

However, because every one of the methods of PTLs 1 and 2 and NPL 1 is performed generating radical species by plasma when using ammonia, hydrogen and the like, there may occur deterioration in step coverage due to deactivation of the radical species during the deposition, for which there is room for improvement.

PTL 3 describes a method for forming a cobalt-based thin film which includes a transport process of transporting bis(N,N'-diisopropyl-propionamidinate)cobalt into a deposition chamber and a film formation process of forming a cobalt-based thin film on a substrate by decomposition of the bis(N,N'-diisopropyl-propionamidinate)cobalt, and uses a reductive gas such as ammonia and hydrogen in the film formation process, where also a mixture gas of ammonia and hydrogen is exemplified.

However, in PTL 3, because cobalt is strongly bonded with nitrogen in bis(N,N'-diisopropyl-propionamidinate)cobalt and accordingly has a lone pair even after reducing the ligand by a reductive gas, there may occur nitrogen incorporation into the cobalt film, for which there is room for improvement.

While a large number of reports have already been presented on research of depositing metal thin films such as of cobalt and copper, deposition of a gold thin film has been considered to be difficult. The first report on a gold thin film by an ALD method is that on a gold thin film formed using plasma oxygen as a reactive gas (NPL 2). In NPL 2, the deposition on a substrate is performed by using trimethylphosphinetrimethylgold (III) as a precursor, heating it to 85° C. to vaporize, and introducing it into a reaction chamber. The method of NPL 2 is the one in which, to deposit gold on the substrate from the precursor adsorbed on the substrate, plasma oxygen is used as a reactive gas to oxidize the trimethylphosphinetrimethylgold (III) by high oxidizability of oxygen radicals and thereby to leave gold on the substrate. While trimethylphosphinotrimethylgold (III) and oxygen do not react with each other at or below 130° C., it is possible to make them react with each other at 120° C. by using plasma to enhance the oxidizability, and thereby to enable formation of a gold thin film by ALD at the temperature. NPL 2 describes that the ALD for depositing a gold on a substrate needs to be performed at a temperature lower than 130° C. because trimethylphosphinotrimethylgold (III) decomposes at or above 130° C. even with no reactive gas and accordingly the deposition proceeds by the same mechanism as that of a thermal CVD method. NPL 2 describes also that, at a temperature lower than 130° C., it is inappropriate to use hydrogen or hydrogen plasma because they cannot cause sufficient reduction. In NPL 2, it is also described that, as a reason why an oxidant such as oxygen and oxygen plasma was tested in the metal deposition, gold oxide (AuO) immediately releases oxygen to change into gold.

NPL 3 discloses a $Ti_{1-x}Al_xN$ gate obtained by depositing a $Ti_{0.75}Al_{0.25}N/TiN/Ti_{0.75}Al_{0.25}N$ triple layer structure on a surface of $Al_2O_3/SiO_2/Si$ by an ALD method using plasma under conditions of 250° C. and 0.6 torr. The method of NPL 3 includes a TiN thin film formation process and an AlN thin film formation process, where the processes are described as nitride thin film formation methods such that: in the TiN film formation process, tetrakis(dimethylamino)titanium (IV) (TDMAT) is used as a precursor and hydrogen plasma or ammonia-hydrogen plasma generated from a mixture gas of ammonia and hydrogen is used as a reactive gas; and in the AlN film formation process, trimethylaluminum (TMA) is used as a precursor and ammonia-hydrogen plasma generated from a mixture gas of ammonia and hydrogen is used as a reactive gas.

However, because both of the methods of NPLs 2 and 3 are performed generating radical species by plasma, it may occur that the radical species are deactivated by recombination on a path before their reacting with a precursor adsorbed on a substrate, thus causing deterioration such as in step coverage on a high aspect ratio substrate and in in-plane uniformity on a large size substrate, for which there is room for improvement.

CITATION LIST

Patent Literature

PTL 1: Japanese Patent Publication No. 6041464
PTL 2: Japanese Laid-Open Patent Application No. 2017-85131
PTL 3: Japanese Patent Publication No. 5916744

Non-Patent Literature

NPL 1: Sang-Joon Park et al., "Thermal and plasma enhanced atomic layer deposition ruthenium and electrical characterization as a metal electrode", Microelectronic Engineering, 85 (2008), 39-44.
NPL 2: Matthew B. E. Griffiths, Peter J. Pallister, David J. Mandia, and Sean T. Barry, "Atomic Layer Deposition of Gold Metal", Chem. Mater., 2016, 28, 44-46.
NPL 3: Sanghun Jeon and Sungho Park, "Fabrication of Robust Triple-$Ti_{1-x}Al_xN$ Metal Gate by Atomic Layer Deposition", Journal of The Electrochemical Society, 157, (12) H1101-H1105 (2010).

SUMMARY OF INVENTION

Technical Problem

An objective of the present invention is to provide a method of depositing a metal thin film by atomic layer deposition (ALD) using an organometallic complex as a source material but not using radical species such as ozone and plasma, which have a possibility of being deactivated.

Solution to Problem

The inventors of the present invention have found that, in an ALD method, by using a mixture gas of an electrophilic gas and a nucleophilic gas against an organometallic complex having an aromatic anionic ligand and/or an alkyl ligand, it becomes possible to deposit a metal thin film without using a plasma or a gas in a radical state, thus having accomplished the present invention.

The present invention includes the following matters.

An atomic layer deposition (ALD) method for metal thin films according to the present invention is characterized by that it includes a process of supplying an organometallic complex having an aromatic anionic ligand into a reaction chamber in which a substrate is installed, and a process of supplying a mixture gas containing a nucleophilic gas and an electrophilic gas into the reaction chamber, and that it substantially does not use either one of a gas in a plasma or radical state and a gas containing oxygen atoms.

The aromatic anionic ligand is preferably a cyclopentadienyl-based ligand.

The organometallic complex preferably has no ligand other than the aromatic anionic ligand.

As another embodiment, the organometallic complex may further have a hydride ligand or an alkyl ligand in addition to the aromatic anionic ligand, within a range not inhibiting an effect of the present invention.

Preferably, the electrophilic gas is hydrogen, and the nucleophilic gas is ammonia.

In the ALD method of the present invention, a temperature of the substrate is preferably set to be 3° C. or more lower than a thermal decomposition temperature of the organometallic complex having an aromatic anionic ligand in an inert gas.

Another atomic layer deposition (ALD) method for metal thin films according to the present invention is characterized by that it includes a process of supplying an organometallic complex having an alkyl ligand into a reaction chamber in which a substrate is installed, and a process of supplying a mixture gas containing a nucleophilic gas and an electrophilic gas into the reaction chamber, and that it substantially does not use either one of a gas in a plasma or radical state and a gas containing oxygen atoms.

The organometallic complex may have a ligand other than an alkyl ligand, where the ligand other than an alkyl ligand is preferably a phosphine ligand.

A metal constituting the organometallic complex is preferably a noble metal.

Preferably, the electrophilic gas is hydrogen, and the nucleophilic gas is ammonia.

In the ALD method of the present invention, a temperature of the substrate is preferably set to be 3° C. or more lower than a thermal decomposition temperature of the organometallic complex in an inert gas.

Advantageous Effects of Invention

According to the present invention, in atomic layer deposition (ALD), it becomes possible to deposit a metal thin film without using radical species such as plasma and ozone, which have a possibility of being deactivated, by using an organometallic complex having an aromatic anionic ligand and/or an alkyl ligand as a source material, and a mixture gas of an electrophilic gas and a nucleophilic gas as a reactive gas.

DESCRIPTION OF EMBODIMENTS

Hereinafter, the atomic layer deposition (ALD) method for metal thin films according to the present invention will be described in detail.

It has been conventional, when depositing a metal thin film by an ALD method, to repeatedly perform a first process of supplying a source material containing atoms of the metal onto a substrate and causing the source material to be adsorbed to saturation (including adsorption accompanied by reaction) on the substrate and a second process of supplying a reactive gas, such as oxygen, ammonia and hydrogen, and thereby causing a portion of the adsorbed source material other than the metal atoms to be released, where in a case of using an organometallic complex as the source material, it has been necessary to use radical species such as plasma and ozone, in order to cause the source material to sufficiently react with the reactive gas.

According to the present invention, in such an ALD method described above, an organometallic complex having an aromatic anionic ligand and/or an alkyl ligand (hereafter, also referred to as a "source material") is supplied into a reaction chamber having a substrate installed therein and, subsequently, a mixture gas containing an electrophilic gas and a nucleophilic gas (hereafter, also referred to as a "reactive gas") is supplied, and it thereby becomes possible to deposit a metal thin film from a reactive gas at a temperature lower than a thermal decomposition temperature of the organometallic complex without using radical species such as plasma and ozone.

Examples of the aromatic anionic ligand include aromatic ligands having a five-membered ring, such as a cyclopentadienyl ligand, a substituted cyclopentadienyl ligand, an indenyl ligand, a substituted indenyl ligand, a pentalenyl ligand, and a substituted pentalenyl ligand. Among these, a cyclopentadienyl ligand and a substituted cyclopentadienyl ligand are preferable, where a substituted cyclopentadienyl ligand is more preferable. Here, each of the substituted ligands refers to a ligand obtained by substituting, with other groups, some or all of hydrogen atoms constituting the five-membered ring. The other groups are preferably those containing no other elements than carbon and hydrogen, where from the viewpoint of ease of synthesis, a methyl group, an ethyl group, a n-propyl group, an isopropyl group and a t-butyl group are preferable. In such a substituted ligand, the other groups may all be the same or may be different. Among such ligands, particularly preferable are an ethylcyclopentadienyl ligand, a pentamethylcyclopentadienyl ligand and a n-propyltetramethylcyclopentadienyl ligand, which are likely to yield an organometallic complex in a liquid state at room temperature.

In the present invention, no restriction is imposed on the number of aromatic anionic ligands coordinating to one metal atom but, because aromatic anionic ligands are bulky, the number is preferably three or less, particularly preferably two or less, from the viewpoint of not inhibiting interaction between the nucleophilic gas and the metal atoms.

The organometallic complex is preferred to have a structure having no other ligands than an aromatic anionic ligand, that is, a structure having only the aromatic anionic ligand coordinated therein, but may also have a ligand other than an aromatic anionic one, within a range not adversely influencing an effect of the present invention. As such a ligand other than an aromatic anionic one, preferable is a ligand to be released by reacting with a reactive gas, or a ligand to be thermally released after release of the aromatic anionic ligand caused by reaction with the reactive gas, where a ligand containing no other elements than carbon and hydrogen is more preferable. Further preferable are hydrogen (a hydride ligand) and an alkyl ligand, where a ligand having a small molecular weight and being free from steric hindrance is preferred. Therefore, a methyl ligand is more preferable among alkyl ligands, and hydrogen (a hydride ligand) is particularly preferable from the viewpoint of molecular weight.

On the other hand, while no particular restriction is imposed on a metal constituting the organometallic complex, a metal unlikely to combine with a reactive gas is preferably used, in order to avoid incorporating a component of the reactive gas. That is, the metal is preferred to be a metal which is easily present in a form of a simple substance and can stably reside on a substrate. Specifically, a preferable metal is that for which the standard electrode potential between a simple substance of the metal and its hydrated ion (when the hydrated ion can have two or more different valences, the lowest one of potential values against the hydrated ion is taken; when the hydrated ion is unstable, a potential against an oxide of the metal is used as a substitute; and when the oxide can be of two or more different valences, the lowest one of potential values against the oxide is taken) is −2 V or higher, more preferably −1 V or higher, further preferably −0.5 V or higher, and particularly preferably −0.3 V or higher.

A combination of a metal atom and an aromatic anionic ligand in an organometallic complex may be selected considering the stability and vapor pressure of the organometallic complex.

In the present invention, an alkyl ligand constituting the organometallic complex is an anionic ligand. Examples of the alkyl ligand include methyl, ethyl, n-propyl, isopropyl, n-butyl, s-butyl and t-butyl ones and the like, and selection among them may be made depending on the stability and vapor pressure of the organometallic complex required for the ALD process.

Further, the organometallic complex may have a nonalkyl ligand additionally, in order to stabilize the alkyl ligand. As such a ligand, a nonionic ligand is preferable, where more preferable is a phosphine ligand. Examples of the phosphine ligand include trimethylphosphine and triphenylphosphine and the like, where trimethylphosphine is particularly preferable.

On the other hand, as a metal constituting the organometallic complex, a metal unlikely to combine with a reactive gas is usually used in order to avoid incorporating a component of the reactive gas. As such a metal, specifically, preferable is a metal for which the standard electrode potential between a simple substance of the metal and its hydrated ion (when the hydrated ion can have two or more different valences, the lowest one of potential values against the hydrated ion is taken; when the hydrated ion is unstable, a potential against an oxide of the metal is used as a substitute; and when the oxide can be of two or more different valences, the lowest one of potential values against the oxide is taken) is −2 V or higher, and more preferably −1 V or higher, and further preferable is a noble metal with a value for the standard electrode potential of −0.3 V or higher. Specifically, the noble metal refers to gold, silver, platinum, palladium, rhodium, iridium, ruthenium or osmium. That is, it is preferable that the metal is easily present in a form of a simple substance and can stably reside on a substrate. Among the noble metals described above, gold is particularly preferable.

Specific examples of the organometallic complex having both alkyl and phosphine ligands include trimethyltrimethylphosphinegold, trimethyltriethylphosphinegold, methyltrimethylphosphinegold and methyltriethylphosphinegold, where trimethyltrimethylphosphinegold is preferable from the viewpoint of ease of use in terms of vapor pressure or the like.

It is general that, in an ALD method, the first and second processes are usually performed at the same substrate temperature. In the first process, it is necessary to set the substrate temperature to be lower than a temperature at which a source material thermally decomposes, and thereby to cause the source material to be adsorbed to saturation.

Here, the substrate temperature refers to a temperature of a substrate installed in the reaction chamber, that is, a temperature at which a source material is adsorbed onto the substrate and also a temperature of the substrate at a time of reacting the source material with a reactive gas. The substrate temperature is usually set at the same value in both of the processes, but when it is different between the processes, a higher one is referred to as the substrate temperature in the present invention.

In the present invention, because a covalent bond is formed between a metal and an aromatic anionic ligand, or between a metal and an alkyl ligand, in the organometallic complex, it is necessary, for the purpose of releasing the aromatic anionic ligand or alkyl ligand not by thermal decomposition, to react the organometallic complex with a reactive gas at a temperature lower than its thermal decomposition temperature and thus transform into a volatile compound. The thermal decomposition temperature, in the present invention, refers to a temperature at which a source material adsorbed on a substrate installed in an evacuated reaction chamber spontaneously decomposes even when no reactive gas is present, and specifically refers to a temperature at which, instead of saturated adsorption of the source material on the substrate, deposition of decomposition products of the source material starts. In consideration of temperature uniformity of the substrate, the substrate temperature needs to be lower than the thermal decomposition temperature by a certain degree or more, and accordingly is set at a temperature which is preferably 3° C. or more lower, more preferably 5° C. or more lower, and particularly preferably 10° C. or more lower, than the thermal decomposition temperature.

To form a metal thin film from the organometallic complex by releasing the aromatic anionic ligand or alkyl ligand, it has been conventional to use only one kind of reductive gas. However, when only either of an electrophilic gas and a nucleophilic gas is used as the reductive gas, the activation energy required for reaction with the aromatic anionic ligand or alkyl ligand cannot be sufficiently decreased, accordingly the reaction is unlikely to occur at a low temperature or at a temperature lower than the thermal decomposition temperature, and it accordingly has been necessary to reduce the activation energy by such as applying plasma processing on the gas and thus generating radical species.

On the other hand, when a mixture gas of an electrophilic gas and a nucleophilic gas is used, as in the present invention, the aromatic anionic ligand or alkyl ligand can be released even at a low temperature. Specifically, the nucleophilic gas interacts with the metal in the organometallic complex, thus reducing the binding energy between the metal and the aromatic anionic ligand or that between the metal and the alkyl ligand, and at the same time the aromatic anionic ligand or alkyl ligand reacts with the electrophilic gas to produce and release a very stable compound, and accordingly thin film formation at a temperature sufficiently lower than the thermal decomposition temperature becomes possible.

Because the present invention aims at forming a metal thin film, each of the electrophilic gas and the nucleophilic gas is preferably a reductive gas.

The electrophilic gas refers to hydrogen, a neutral molecule having a portion positively charged by polarization (such as hydrogen chloride, various Lewis acids, alkyl halides, carboxylic halides and carbonyl compounds) and a molecule in which polarization is induced by a nucleophilic species' approach, where no radical species is included. Among them, those containing no other elements than hydrogen and carbon are preferable as the electrophilic gas used here, where hydrogen is particularly preferable.

The nucleophilic gas refers to a neutral molecule having a lone pair. As the nucleophilic gas, amines are preferable, where from the viewpoint of easiness in accessing the metal and in volatilization during thin film formation by ALD, those having a small molecular weight are preferable, and ammonia is most preferable.

In the present invention, by using the organometallic complex as a source material and using the electrophilic gas and nucleophilic gas in combination as a reactive gas, it becomes possible to release the aromatic anionic ligand or alkyl ligand at a temperature lower than the thermal decomposition temperature, which was impossible in the prior art, and thereby to perform thin film formation by ALD.

EXAMPLES

Hereinafter, the present invention will be described in more detail according to examples, but the present invention is not limited by the examples described below.

Example 1

In a tubular furnace with its inside substituted with argon by supplying the argon into it, bis(ethylcyclopentadienyl) ruthenium and a substrate fabricated by cutting it out from a silicon wafer into a size of about a few centimeters square were installed in this order from the side of a gas inlet. Then, a mixture gas of 1.5 L/min of ammonia and 0.5 L/min of hydrogen was supplied. When this system was heated to 300° C., a slight amount of deposit was detected on the substrate. Identified by SEM-EDX, the deposit was confirmed to be ruthenium.

NPL 1 describes that thin film formation by ALD was possible at a substrate temperature of 300° C. using bis (ethylcyclopentadienyl)ruthenium and ammonia plasma, which indicates that bis(ethylcyclopentadienyl)ruthenium does not thermally decompose at 300° C. Therefore, the present example has proved that a thin film of ruthenium metal can be formed by ALD using bis(ethylcyclopentadienyl)ruthenium and a mixture gas of ammonia and hydrogen.

Example 2

Trimethyltrimethylphosphinegold ((CH$_3$)$_3$AuP(CH$_3$)$_3$) was obtained using a method described in Supporting Information of NPL 2. In a tubular furnace, the trimethyltrimethylphosphinegold and a substrate fabricated by cutting it out from a silicon wafer into a size of about a few centimeters square were installed in this order from the side of a gas inlet. After supplying argon gas at 2 L/min for 20 minutes, thus substituting the system with argon, a mixture gas of 1 L/min of ammonia and 1 L/min of hydrogen was supplied. When this system was heated to 120° C., gold-colored precipitate was detected on the substrate since around when the substrate temperature exceeded 110° C. Identified by EDX, the precipitate was confirmed to be gold.

NPL 2 describes that trimethyltrimethylphosphinegold has a thermal decomposition temperature of 130° C. and its use with plasma oxygen enables thin film formation by ALD at 120° C. Considering the description in combination with the result of the present example, it has been proved here that thin film formation by ALD using trimethyltrimethylphosphinegold and a mixture gas of ammonia and hydrogen can be performed at a substrate temperature of 120° C.

Comparative Example 1

When only hydrogen was supplied at 2 L/min, instead of the total of 2 L/min of mixture gas of ammonia and hydrogen used in the Example 2, and the system was heated to 120° C., no gold-colored precipitate was detected on the substrate. When, subsequently, only ammonia was supplied at 2 L/min, after substituting the system with argon supplied into it at room temperature, and the system was heated to 120° C., no gold-colored precipitate was detected on the substrate.

The invention claimed is:

1. An atomic layer deposition (ALD) method for metal thin films comprising:
a first process of supplying an organometallic complex having an aromatic anionic ligand that coordinates to a metal into a reaction chamber in which a substrate is installed, a covalent bond being formed between the metal and the aromatic anionic ligand, wherein a metal constituting the organometallic complex is a noble metal, wherein the noble metal is gold, silver, platinum, palladium, rhodium, iridium, or osmium, wherein the substrate is set at a temperature which is 3° C. or more lower than a thermal decomposition temperature of the organometallic complex in an inert gas,
the organometallic complex is adsorbed to the substrate to saturation; and
a second process of supplying a mixture gas containing a nucleophilic gas and an electrophilic gas into the reaction chamber, wherein
the aromatic anionic ligand is released from the organometallic complex,
the aromatic anionic ligand contains no other elements than carbon and hydrogen,
the organometallic complex has a structure having no other ligands than the aromatic anionic ligand or a structure having one or more hydride ligands in addition to the aromatic anionic ligand,
the electrophilic gas is hydrogen and the nucleophilic gas is ammonia; and
the ALD method substantially not using either one of a gas in a plasma or radical state and a gas containing oxygen atoms.

2. The ALD method according to claim 1,
wherein the aromatic anionic ligand is a cyclopentadienyl ligand or a substituted cyclopentadienyl ligand in which some or all of hydrogen atoms constituting the five-membered ring are replaced with a methyl group, an ethyl group, a n-propyl group, an isopropyl group or a t-butyl group.

3. The ALD method according to claim 1, wherein the substrate is set at a temperature which is 10° C. or more lower than a thermal decomposition temperature of the organometallic complex in an inert gas.

* * * * *